(12) United States Patent
Nakagoshi

(10) Patent No.: US 7,928,559 B2
(45) Date of Patent: Apr. 19, 2011

(54) SEMICONDUCTOR DEVICE, ELECTRONIC COMPONENT MODULE, AND METHOD FOR MANUFACTURING SEMICONDUCTOR DEVICE

(75) Inventor: Hideo Nakagoshi, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 151 days.

(21) Appl. No.: 12/277,360

(22) Filed: Nov. 25, 2008

(65) Prior Publication Data

US 2009/0072383 A1  Mar. 19, 2009

Related U.S. Application Data

(63) Continuation of application No. PCT/JP2007/054407, filed on Mar. 7, 2007.

(30) Foreign Application Priority Data

May 26, 2006 (JP) ................................. 2006-146120

(51) Int. Cl.
*H01L 23/10* (2006.01)
*H01L 23/34* (2006.01)
(52) U.S. Cl. ......... 257/706; 257/707; 257/720; 438/122
(58) Field of Classification Search .......... 257/706–707, 257/720, 723, E23.08, E21.001; 438/122
See application file for complete search history.

(56) References Cited

U.S. PATENT DOCUMENTS

| 5,923,084 | A | * | 7/1999 | Inoue et al. ............ 257/712 |
| 6,225,695 | B1 | | 5/2001 | Chia et al. |
| 2003/0169575 | A1 | * | 9/2003 | Ikuta et al. ............ 361/761 |
| 2004/0023463 | A1 | | 2/2004 | Shirakawa |
| 2005/0263859 | A1 | | 12/2005 | Kime et al. |
| 2006/0043576 | A1 | | 3/2006 | Lee |

FOREIGN PATENT DOCUMENTS

| DE | 10 2005 024 945 A1 | 12/2006 |
| EP | 0 971 418 A2 | 1/2000 |
| JP | 2001-44243 A | 2/2001 |
| JP | 2001-284503 A | 10/2001 |
| JP | 2003-258165 A | 9/2003 |
| WO | 2006/032219 A1 | 3/2006 |

OTHER PUBLICATIONS

Official Communication issued in corresponding European Patent Application No. 07737921.2, mailed on Mar. 17, 2010.
Official Communication issued in International Patent Application No. PCT/JP2007/054407, mailed on Jun. 12, 2007.

* cited by examiner

*Primary Examiner* — Theresa T Doan
(74) *Attorney, Agent, or Firm* — Keating & Bennett, LLP

(57) ABSTRACT

A semiconductor element is provided with a heat dissipating path defined by a non-through hole in a first principal surface and that is filled with a conductive material. The semiconductor element is bonded to a heat sink with the conductive material disposed therebetween. Solder can be used as the conductive material, for example. By introducing molten solder into the non-through hole while having solder disposed between the semiconductor element and the heat sink, the heat dissipating path is provided and the heat sink is bonded to the semiconductor element.

4 Claims, 2 Drawing Sheets

SEMICONDUCTOR DEVICE, ELECTRONIC COMPONENT MODULE, AND METHOD FOR MANUFACTURING SEMICONDUCTOR DEVICE

BACKGROUND OF THE INVENTION

1. Field of the Invention

The present invention relates to a semiconductor device, an electronic component module including a semiconductor device, and a method for manufacturing a semiconductor device. In particular, the present invention relates to semiconductor element having improved heat dissipation characteristics and that is included in a semiconductor device.

2. Description of the Related Art

For a semiconductor device including a semiconductor element, when heat is produced in the semiconductor element during its operation, it is important to efficiently dissipate the heat in order to prevent the semiconductor element from being degraded or destroyed and to ensure reliability of the semiconductor element. Accordingly, various techniques for improving the heat dissipation characteristics of a semiconductor element are being developed.

A known semiconductor device including a heat dissipating unit is disclosed in, for example, Japanese Unexamined Patent Application Publication No. 2001-284503. Japanese Unexamined Patent Application Publication No. 2001-284503 discloses a configuration in which a heat dissipating unit is arranged relative to a semiconductor element mounted on a principal surface of a wiring board with conductor bumps disposed therebetween. The heat dissipating unit includes a flat-shaped portion and a projection disposed in a central portion of the flat-shaped portion. The semiconductor element includes a through hole arranged in a direction substantially perpendicular to the principal surface. The heat dissipating unit is arranged such that its projection is inserted in the through hole and the flat-shaped portion is arranged along the principal surface of the semiconductor element, and the heat dissipating unit functions so as to dissipate heat of the semiconductor element.

As described above, the configuration described in the Japanese Unexamined Patent Application Publication No. 2001-284503 having favorable heat dissipation characteristics are obtained by providing a portion of the heat dissipating unit, i.e., the projection inside the semiconductor element having heat generation. Unfortunately, the configuration described in Japanese Unexamined Patent Application Publication No. 2001-284503 has the following problems.

First, the semiconductor element includes the through hole arranged such that the projection of the heat dissipating unit can be inserted therein. This through hole portion produces wasted space because circuit elements cannot be arranged in the through hole portion. This makes it difficult to miniaturize the semiconductor element, and correspondingly, makes it difficult to miniaturize the semiconductor device including the semiconductor element.

In addition, manufacturing the heat dissipating unit having the projection is relatively complicated and expensive. In this case, if the size of the projection is reduced to reduce the size of the wasted space in the semiconductor element, highly precise micromachining is required, which further increases the cost of manufacturing. On the other hand, if the size of the projection is increased to avoid an increase in the cost of manufacturing, the wasted space is increased.

It is necessary to insert the projection provided in the heat dissipating unit into the through hole of the semiconductor element when mounting the heat dissipating unit on the semiconductor device. Unfortunately, aligning the projection and the through hole during insertion is relatively complicated, which makes it difficult to improve productivity. In particular, when the heat dissipating unit includes a plurality of projections, because it is necessary to insert the plurality of projections into a plurality of through holes provided in the semiconductor element at the same time, it is even more difficult to align the projections, which results in further degradation in productivity.

SUMMARY OF THE INVENTION

To overcome problems described above, preferred embodiments of the present invention provide a semiconductor device, an electronic component module including the semiconductor device, and a method for manufacturing the semiconductor device.

A semiconductor device according to a preferred embodiment of the present invention includes a semiconductor element and a metallic heat sink arranged along a first principal surface of the semiconductor element. The semiconductor element is provided with a heat dissipating path, the heat dissipating path being defined by a non-through hole in the first principal surface and formed by filling the non-through hole with a conductive material, and the heat sink is bonded to the semiconductor element with the conductive material disposed therebetween.

The conductive material may preferably include solder.

When a conductive film is disposed on a second principal surface of the semiconductor element that is opposite to the first principal surface, a bottom of the non-through hole may preferably be defined by the conductive film.

Another preferred embodiment of the present invention is directed to an electronic component module including the semiconductor device described above and a wiring board having a cavity. In the electronic component module according to this preferred embodiment of the present invention, the semiconductor device is arranged in the cavity such that the heat sink faces outward.

Another preferred embodiment of the present invention is directed to a method for manufacturing a semiconductor device. The method for manufacturing a semiconductor device according to this preferred embodiment the present invention includes the following steps.

A semiconductor element including a non-through hole in a first principal surface is prepared, and a conductive material to be filled in the non-through hole to form a heat dissipating path is prepared. Further, a metallic heat sink to be arranged along the first principal surface of the semiconductor element is prepared.

The heat sink is arranged along the first principal surface of the semiconductor element, the conductive material in a molten state is filled in the non-through hole while the solder is disposed between the first principal surface of the semiconductor element and the heat sink, the heat dissipating path in which the non-through hole is filled with the conductive material is thus formed, and the heat sink is bonded to the semiconductor element with the conductive material disposed therebetween is established.

Before providing the molten conductive material in the non-through hole, as described above, a step of forming a metallic film on an inner surface of the non-through hole and on the first principal surface may preferably be performed.

In accordance with preferred embodiments of the present invention, because the hole defining the heat dissipating path does not extend through the semiconductor element, the conductive material does not flow out of the hole, and is retained in the hole. Accordingly, a fluid material, such as the molten solder, can be used without problems.

In accordance with a method for manufacturing a semiconductor device according to preferred embodiments of the present invention, as described above, a fluid material can be used as the conductive material, the fluid material can be introduced into the non-through hole utilizing the fluidity of the molten solder, and thus, the heat dissipating path is formed by filling the non-through hole with the solder, and the state in which the heat sink is bonded to the semiconductor element with the solder disposed therebetween is obtained. Accordingly, unlike in the above-described technique described in the Japanese Unexamined Patent Application Publication No. 2001-284503, a complicated process of forming a projection in a heat dissipating member in advance and then inserting the projection into a though hole of a semiconductor element is not required. Therefore, the semiconductor device can be manufactured with high productivity. Because there is no need to form a projection in a heat sink in advance and a simple flat shape can be used as the heat sink, the heat sink can be manufactured at a lower cost than that of the heat dissipating member described in Japanese Unexamined Patent Application Publication No. 2001-284503.

In the method for manufacturing the semiconductor device described above, when the molten solder is introduced into the non-through hole after the metallic film is formed on the inner surface of the non-through hole and on the first principal surface of the semiconductor element, a wet-up phenomenon of the metallic film acts, in addition to the capillary action caused by the non-through hole. Accordingly, the solder can be introduced into the hole quickly with high filling capabilities.

As long as a circuit arrangement in the semiconductor element is not affected, any number of heat dissipating paths can be provided at any location within the semiconductor element. As a result, when a heat dissipating path is disposed in the vicinity of a heating producing portion within the semiconductor element, greater heat dissipation effects are obtained. When a heat dissipating path is disposed at a location in which the circuit arrangement in the semiconductor element is not required, an increase in the size of the semiconductor element caused by the heat dissipating path is prevented.

In accordance with preferred embodiments of the present invention, the heat sink is bonded to the semiconductor element with the conductive material that is disposed therebetween and that provides the heat dissipating path provided to the semiconductor element, and in this state, the heat dissipating path produces an anchoring effect. Accordingly, the strength of bonding the heat sink to the semiconductor element is improved.

When solder is used as the conductive material in the semiconductor device according to preferred embodiments of the present invention, increased thermal conductivity is obtained, and heat dissipation characteristics are enhanced. The use of solder including no resin component and having a high melting point does not cause a bonding state to change over time even when the semiconductor element generates heat, such that a highly reliable bonding state between the semiconductor element and the heat sink is obtained.

When the conductive film is disposed on the second principal surface of the semiconductor element and the bottom of the non-through hole is defined by this conductive film in the semiconductor device according to preferred embodiments of the present invention, the conductive film, the heat dissipating path, and the heat sink can be used as a grounding path. This can reduce the impedance and improve the characteristics of the semiconductor device and the electronic component module including the semiconductor device, and enable support for higher frequencies.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
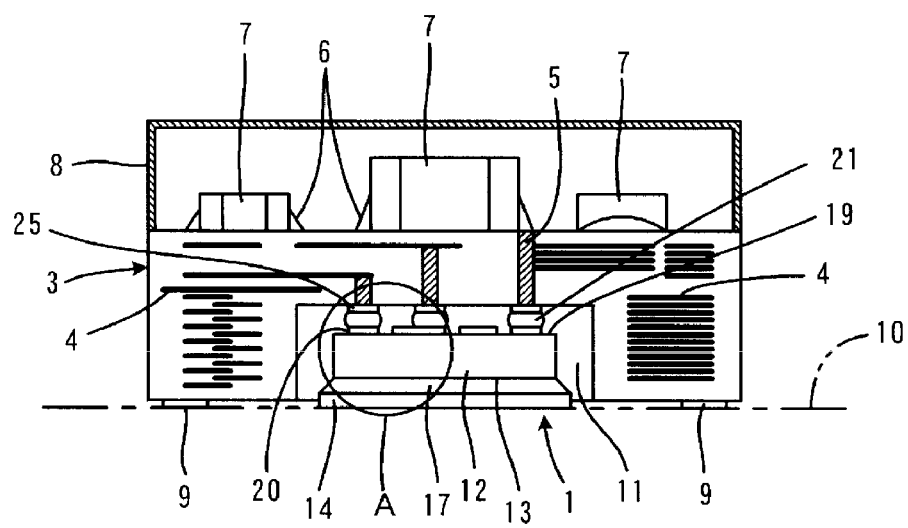
FIG. 1 is a cross-sectional view that illustrates an electronic component module including a semiconductor device according to a preferred embodiment of the present invention.
Figure 2:
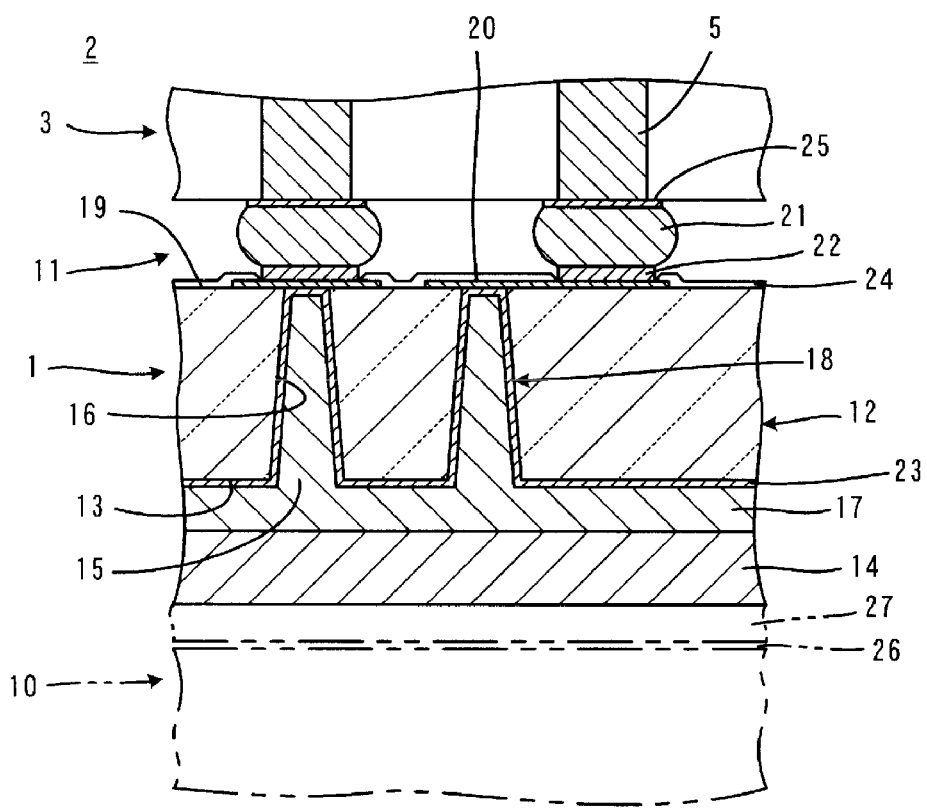
FIG. 2 is an enlarged cross-sectional view that illustrates a portion A shown in FIG. 1.

FIG. 1 is a cross-sectional view that illustrates an electronic component module 2 including a semiconductor device 1 according to a preferred embodiment of the present invention. FIG. 2 is an enlarged cross-sectional view that illustrates a portion A shown in FIG. 1.

The electronic component module 2 includes a wiring board 3. The wiring board 3 has a multilayer structure in which a plurality of ceramic layers or organic material layers are laminated. The wiring board 3 includes at least one internal conductive film 4 and at least one via-hole conductor 5 provided therein. A wiring conductor including these internal conductive films 4 and via-hole conductors 5 preferably defines a passive element, for example, an inductor, a capacitor, and a resistor.

At least one external conductive film (not shown) is provided on the upper surface of the wiring board 3 as required. At least one surface-mountable component 7 is mounted while being connected to these external conductive films with solder 6 disposed therebetween. Additionally, a metallic cover 8 is attached to the wiring board 3 so as to cover the surface-mountable components 7. At least one external conductive film 9 is provided on the lower surface of the wiring board 3. The external conductive film 9 functions as a terminal electrode preferably used when the electronic component module 2 is mounted on a mother board 10, which is indicated by phantom lines.

A cavity 11 is provided in the lower surface of the wiring board 3. The semiconductor device 1 is arranged in the cavity 11. The semiconductor device 1 includes a semiconductor element 12 and a heat sink 14 arranged along a first principal surface 13 of the semiconductor element 12. The semiconductor device 1 is arranged in the cavity 11 such that the heat sink 14 faces outward. Preferably, the heat sink 14 has a simple flat shape and can be made of a metal that has relatively high thermal conductivity, for example, a Ni—Co—Fe alloy, Ni—Fe alloy, Ni—Cr—Fe alloy, Cr—Fe alloy, Cr—Ni alloy, copper, or aluminum. The heat sink 14 is preferably as thin as possible while obtaining satisfactory heat dissipation characteristics.

Because FIG. 1 does not illustrate a detailed cross section of the semiconductor element 12, the structure of the electronic component module 2 is described in further detail with reference to FIG. 2. The semiconductor element 12 is provided with at least one heat dissipating path 18 defined by at least one non-through hole 16. The at least one non-through hole 16 is made by providing at least one opening 15 in the first principal surface 13 and filling the at least one opening 15 with a conductive material 17. The heat sink 14 is bonded to the semiconductor element 12 with the conductive material 17 disposed therebetween.

The conductive material 17 is preferably solder, conductive paste or conductive adhesive, for example. Particularly preferably, the conductive material 17 is made of solder. The conductive material 17 may preferably be made of different materials; one for a portion inside the non-through holes 16 and the other for a portion outside the non-through holes 16.

At least one conductive film 20 is provided on a second principal surface 19 of the semiconductor element 12, the second principal surface 19 being opposite to the first principal surface 13. In the present preferred embodiment, the bottom of each of the non-through holes 16 is defined by a corresponding conductive film 20.

At least one conductive bump 21 is disposed on the second principal surface of the semiconductor element 12. More specifically, under-bump metal 22 is provided on the conductive films 20, and the conductive bumps 21 are provided thereon.

Examples of the material of each of the conductive bumps 21 include gold or conductive resin. One particularly preferable example is solder. When the conductive bump 21 is composed of solder, the under-bump metal 22 can be composed of, for example, a titanium film formed on each of the conductive films 20 and a nickel film formed thereon.

One example of the solder for the conductive bump 21 is $Sn_{3.5}Ag$ solder (melting at about 221° C.). One example of the solder for the conductive material 17 is $Au_{20}Sn$ solder (melting at about 280° C.).

A metallic film 23 is provided on the inner surface of each of the non-through holes 16 and on the first principal surface 13 of the semiconductor element 12. The conductive material 17 is arranged so as to be in contact with the metallic film 23. A protective film 24 is provided so as to cover the second principal surface 19 of the semiconductor element 12.

Although not shown in FIGS. 1 and 2, underfill resin is injected between the semiconductor element 12 and the internal surface of the cavity 11.

As previously described, the semiconductor device 1 including the semiconductor element 12 and the heat sink 14 is received in the cavity 11 of the wiring board 3, and the semiconductor device 1 is melt-bonded to a conductive film 25 provided on the bottom of the cavity 11 with the conductive bump 21 disposed therebetween. The conductive film 25 can be electrically connected to the via-hole conductor 5.

The electronic component module 2 having the structure described above is mounted on the mother board 10, as previously described. As indicated by the phantom lines in FIG. 2, the mother board 10 includes a conductive film 26. When the electronic component module 2 is disposed on the mother board 10, the heat sink 14 is bonded to the conductive film 26 with solder 27 disposed therebetween over substantially the entire surface thereof. Examples of the solder 27 include $Sn_3Ag_{0.5}Cu$ (melting at about 219° C.) and $Sn_{0.7}Cu$ (melting at about 227° C.).

Heat generated in the semiconductor element 12 is conveyed to the heat sink 14 through the heat dissipating paths 18 and is dissipated to the mother board 10 through the solder 27 and the conductive film 26. At this time, arranging the heat dissipating paths 18 in the vicinity of the heating portion inside the semiconductor element 12 provides greater dissipating effects.

Because each of the heat dissipating paths 18 is also conductive, circuitry defined by the conductive films 20 on the second principal surface 19 of the semiconductor element 12 can be grounded through the heat dissipating path 18 and the heat sink 14 using a short distance. Accordingly, the impedance of the grounding path can be reduced. As a result, the characteristics of the semiconductor device 1 and the electronic component module 2 can be improved, which facilitate support for higher frequencies.

The heat dissipating path 18 can be disposed at a location at which it is originally unnecessary to arrange circuits in the semiconductor element 12. This prevents an increase in the size of the semiconductor element 12 caused by the heat dissipating path 18.

Additionally, because the heat dissipating path 18 provides an anchoring effect, the bonding strength of the heat sink 14 to the semiconductor element 12 can be improved, and the reliability of bonding the electronic component module 2 to the mother board 10 is improved.

A method for manufacturing the electronic component module 2 according to a preferred embodiment of the present invention is described below with reference to FIG. 3.

First, the wiring board 3, the surface-mountable component 7, and the metallic cover 8 illustrated in FIG. 1 are prepared, and the semiconductor element 12 is prepared.

For the semiconductor element 12, for example, a titanium film having a thickness of about 0.2 μm and a nickel film having a thickness of about 5.0 μm formed thereon are preferably provided on each of the conductive films 20 formed on the second principal surface 19 to define the under-bump metal 22. Additionally, the conductive bump 21 preferably made of, for example, $Sn_{3.5}Ag$ solder is formed on the under-bump metal 22, and the protective film 24 preferably made of, for example, silicon dioxide is formed.

After the semiconductor element 12 is ground so as to have a predetermined thickness, the non-through holes 16 are formed in the first principal surface 13 side of the semiconductor element 12 by etching. Each of the holes 16 is preferably a hole having a substantially circular cross-sectional shape and a dimension in the diameter direction of approximately 60 μm, for example. However, the size and the cross-sectional shape of the hole 16 are not particularly limited. For example, the cross-sectional shape may preferably be a square, a rectangle, or a triangle.

Then, the metallic film 23 is formed on the inner surface of the non-through hole 16 and on the first principal surface 13. To form the metallic film 23, for example, a titanium film having a thickness of about 0.05 μm and then a gold film having a thickness of about 0.1 μm are preferably formed using a thin-film process, and after that, a gold film having a thickness of about 3.0 μm is formed using electroplating.

To form the heat dissipating path 18, solder used as the conductive material 17 to be filled in the non-through hole 16 is prepared, and the heat sink 14 to be arranged along the first principal surface 13 of the semiconductor element 12 is prepared. More specifically, a metal plate made of, for example, a Ni—Co—Fe alloy is prepared, and after the metal plate is rolled, nickel plating and gold plating are applied thereon as a surface treatment. Then, solder sheet is melt-bonded to the metal plate by being melted while being overlaid on one side of the metal plate.

Here, $Au_{20}Sn$ solder can preferably be used as the solder, for example. Because the melting point of this solder is greater than that of the solder 27 used to mount the electronic component module 2 on the mother board 10, this solder is not re-melted during mounting on the mother board 10, such that the bonding reliability between the semiconductor element 12 and the heat sink 14 is not degraded. The above-described melting bonding is typically performed in a reducing atmosphere using a reflow oven whose peak temperature is set to about 320° C.

Then, the metal plate with the solder sheet being bonded is die-cut to desired dimensions, and thus, the heat sink 14 is obtained. FIG. 3 illustrates the heat sink 14 bonded to the solder sheet defining the conductive material 17.

Alternatively, after the heat sink 14 is obtained by die-cutting the metal plate to desired dimensions, the solder sheet may be melt-bonded thereto. Instead of the solder sheet, solder paste may be applied to the metal plate or the heat sink 14.

Then, flux is preferably applied on the conductive bump 21 of the semiconductor element 12 by, for example, transferring. The semiconductor element 12 is arranged such that the conductive bump 21 is located on the conductive film 25 inside the cavity 11 of the wiring board 3. In this state, the conductive bump 21 is melt-bonded to the conductive film 20 by reflowing. After that, a residue of the flux is removed by cleaning.

Then, although not shown in the drawing, the underfill resin is injected between the semiconductor element 12 and the cavity 11 and cured.

Figure 3:
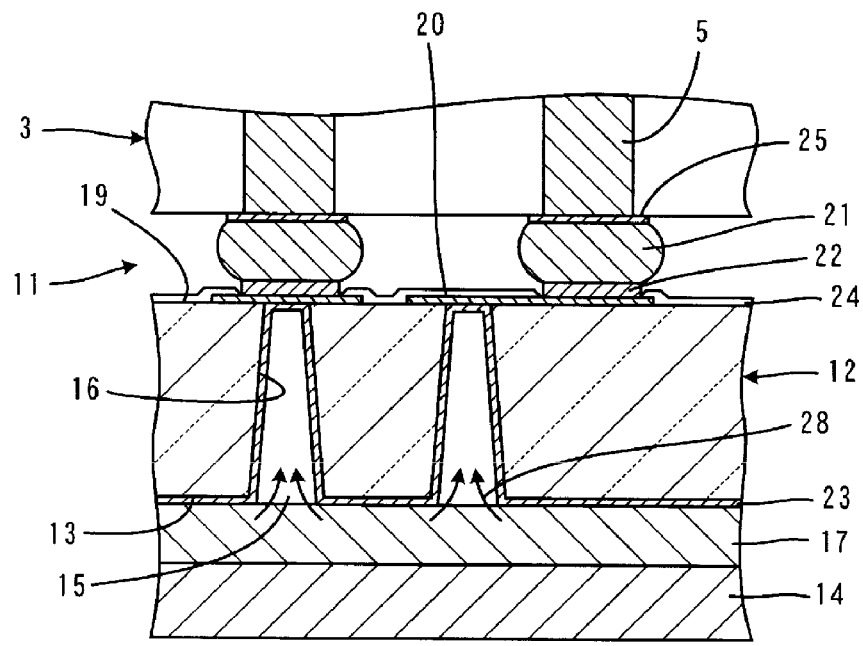
FIG. 3 is an illustration describing a method for manufacturing the electronic component module described with reference to FIGS. 1 and 2 and that corresponds to FIG. 2.

Then, as illustrated in FIG. 3, the heat sink 14 is arranged along the first principal surface 13 of the semiconductor element 12 such that the solder sheet defining the conductive material 17 faces the first principal surface 13 of the semiconductor element 12. When the solder lies between the first principal surface 13 of the semiconductor element 12 and the heat sink 14, the molten solder is filled in the non-through hole 16, as indicated by the arrow 28. At this time, in addition to capillary action caused by the non-through hole 16, a wet-up phenomenon of the metallic film 23 is produced. Therefore, the solder defining the conductive material 17 can be filled in the hole 16 quickly with high filling capabilities. This process can preferably be performed using, for example, a reflow oven. The atmosphere in the reflow oven may preferably be a reducing atmosphere, for example. The temperature is selected at which the solder defining the conductive material 17 is sufficiently melted. Typically, a temperature greater than the melting point of the solder by about 30° C. to about 50° C., for example, can preferably be selected as the temperature in the reflow oven, and with $Au_{20}Sn$ solder, about 320° C., for example, may preferably be selected.

As described above, when the solder defining the conductive material 17 that is filled in the non-through hole 16 is solidified, the heat dissipating path 18 is formed, and the heat sink 14 is bonded to the semiconductor element 12 with the solder disposed therebetween.

Then, as illustrated in FIG. 1, the surface-mountable component 7 is provided on the upper surface of the wiring board 3. After that, the metallic cover 8 is attached to the wiring board 3, and the electronic component module 2 is completed.

Figure 4:
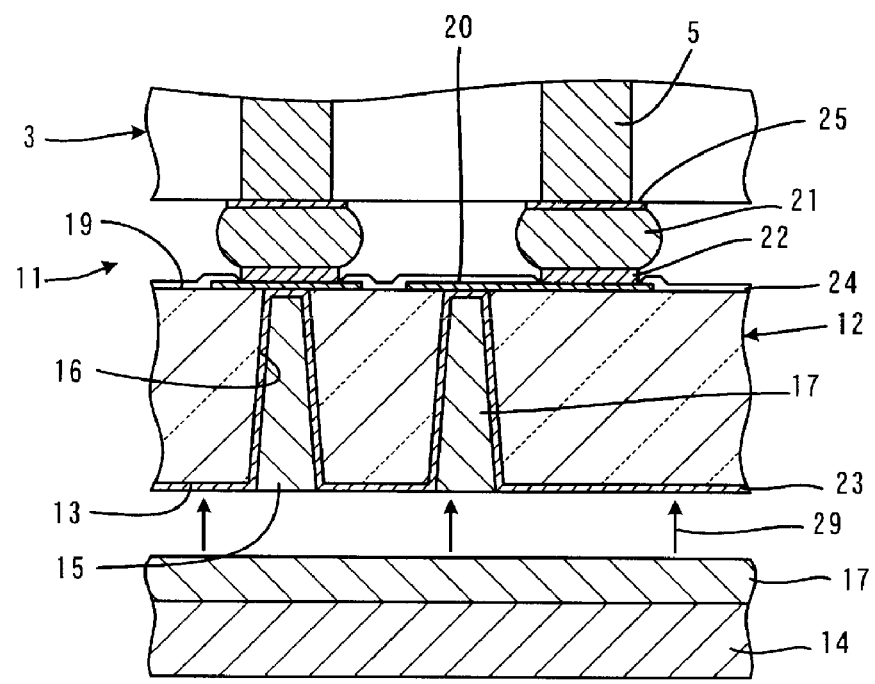
FIG. 4 is an illustration describing another method for manufacturing the electronic component module described with reference to FIGS. 1 and 2 and that corresponds to FIG. 2 or FIG. 3.

FIG. 4 is an illustration that describes a method for manufacturing the electronic component module 2 according to another preferred embodiment of the present invention, in particular, the semiconductor device 1 and corresponds to FIG. 3. In FIG. 4, the same reference numerals are used for elements corresponding to those illustrated in FIG. 2 or 3, and the redundant description thereof is omitted.

The manufacturing method illustrated in FIG. 4 is a method for forming the heat dissipating path 18. That is, the conductive material 17 located inside the non-through hole 16 and the conductive material 17 located between the semiconductor element 12 and the heat sink 14 are applied in different processes. In other words, at a stage prior to bonding the heat sink 14 to the semiconductor element 12, the non-through hole 16 of the semiconductor element 12 is filled with the conductive material 17. After that, as indicated by the arrow 29, the heat sink 14 is bonded to the first principal surface 13 of the semiconductor element 12 with the remaining conductive material 17 disposed therebetween.

As described above, molten solder, metallic paste, or conductive adhesive can preferably be used as the conductive material 17 filled in the non-through hole 16. The non-through hole 16 may preferably be filled with conductive material 17 by growing metal plating or laminating metallic films using a thin-film process, for example. Alternatively, a small piece made of a conductive material may preferably be inserted into the non-through hole 16. During bonding of the heat sink 14 to the semiconductor element 12 using the remaining conductive material 17, solder, metallic paste, or conductive adhesive can preferably be used as the conductive material 17, for example.

The preferred embodiments of the present invention have been described above with reference to the drawings. Various other modifications can also be made.

For example, the bottom of the non-through hole 16 is defined by the conductive film 20 in the illustrated preferred embodiment. However, the bottom of the non-through hole may be arranged in an intermediate portion of the semiconductor element 12 in its thickness direction.

The solder used as the conductive material 17 in the manufacturing method described with reference to FIG. 3 may be replaced by fluid metallic paste or conductive adhesive, for example.

In addition to or in place of the surface-mountable component 7 mounted on the upper surface of the wiring board 3 as illustrated in FIG. 1, a different semiconductor element may preferably be mounted by flip-chip mounting or wire bonding, for example. Alternatively, no component may be mounted on the upper surface of the wiring board 3.

In the electronic component module 2 illustrated in FIG. 1, the metallic cover 8 may be replaced by a resin coating.

A cavity other than the illustrated cavity 11 may be provided to the wiring board 3.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A semiconductor device comprising:
    a semiconductor element; and
    a metallic heat sink arranged along a first principal surface of the semiconductor element; wherein
    the semiconductor element is provided with a heat dissipating path, the heat dissipating path being defined by a non-through hole provided in the first principal surface and filled with a conductive material; and
    the heat sink is bonded to the semiconductor element with the conductive material disposed therebetween.

2. The semiconductor device according to claim 1, wherein the conductive material includes solder.

3. The semiconductor device according to claim 1, further comprising:
   a conductive film disposed on a second principal surface of the semiconductor element opposite to the first principal surface; wherein
   a bottom of the non-through hole is defined by the conductive film.

4. An electronic component module comprising:
   the semiconductor device according to claim 1; and
   a wiring board having a cavity; wherein
   the semiconductor device is disposed in the cavity such that the heat sink faces outward.

* * * * *